(12) United States Patent
Graham

(10) Patent No.: US 8,415,623 B2
(45) Date of Patent: Apr. 9, 2013

(54) PROCESSING DETECTOR ARRAY SIGNALS USING STACKED READOUT INTEGRATED CIRCUITS

(75) Inventor: Roger W. Graham, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 120 days.

(21) Appl. No.: 12/952,282

(22) Filed: Nov. 23, 2010

(65) Prior Publication Data

US 2012/0126121 A1    May 24, 2012

(51) Int. Cl.
*G01J 5/00* (2006.01)

(52) U.S. Cl.
USPC ...................................................... 250/338.1

(58) Field of Classification Search ................ 250/338.1
See application file for complete search history.

(56) References Cited

U.S. PATENT DOCUMENTS

| | | | |
|---|---|---|---|
| 5,512,750 A * | 4/1996 | Yanka et al. ............... | 250/338.4 |
| 5,892,541 A | 4/1999 | Merrill | |
| 5,981,950 A * | 11/1999 | Wolny et al. ............... | 250/338.4 |
| 6,078,037 A | 6/2000 | Booth, Jr. | |
| 6,115,065 A | 9/2000 | Yadid-Pecht et al. | |
| 6,456,326 B2 | 9/2002 | Fossum et al. | |
| 6,493,030 B1 | 12/2002 | Kozlowski et al. | |
| 6,504,141 B1 | 1/2003 | Kozlowski et al. | |
| 6,875,975 B2 * | 4/2005 | Faska et al. ................ | 250/214.1 |
| 6,885,002 B1 | 4/2005 | Finch et al. | |
| 6,924,841 B2 | 8/2005 | Jones | |
| 7,091,531 B2 | 8/2006 | Boemler | |
| 7,095,355 B1 | 8/2006 | Graham et al. | |
| 7,119,317 B2 | 10/2006 | Ando et al. | |
| 7,586,074 B2 | 9/2009 | Gulbransen et al. | |
| 7,616,243 B2 | 11/2009 | Kozlowski | |
| 7,723,815 B1 * | 5/2010 | Peterson et al. ............. | 257/443 |
| 2006/0181627 A1 * | 8/2006 | Farrier ......................... | 348/308 |
| 2007/0102622 A1 | 5/2007 | Olsen et al. | |
| 2009/0173883 A1 * | 7/2009 | Kauffman et al. ......... | 250/338.4 |
| 2011/0042772 A1 * | 2/2011 | Hampp et al. ............... | 257/443 |

* cited by examiner

*Primary Examiner* — Christine Sung
(74) *Attorney, Agent, or Firm* — Lando & Anastasi, LLP

(57) ABSTRACT

According to certain embodiments, an apparatus comprises a first readout integrated circuit (ROIC), a second ROIC, and a dual band detector array. The first ROIC comprises first unit cells. The second ROIC is disposed outwardly from the first ROIC and comprises a second unit cells. Electrically conductive vias are disposed through the second ROIC and at least into the first ROIC. The detector array is disposed outwardly from the second ROIC. The detector array is configured to detect high dynamic range infrared light and comprises detector pixels. Each detector pixel is configured to generate a current in response to detecting light and send the current to a via. A via is configured to send the signal to a second unit cell and a first unit cell.

20 Claims, 2 Drawing Sheets

PROCESSING DETECTOR ARRAY SIGNALS USING STACKED READOUT INTEGRATED CIRCUITS

TECHNICAL FIELD

This invention relates generally to the field of detector arrays and more specifically to processing detector array signals using stacked readout integrated circuits.

BACKGROUND

Detector systems may include a detector array and a read out integrated circuit (ROIC). A detector array may include detector pixels that detect light and generate currents in response to detecting the light. An ROIC may include unit cells that process the currents generated by the detector pixels.

SUMMARY OF THE DISCLOSURE

In accordance with the present invention, disadvantages and problems associated with previous techniques for processing detector current may be reduced or eliminated.

According to certain embodiments, an apparatus comprises a first readout integrated circuit (ROIC), a second ROIC, and a dual band detector array. The first ROIC comprises first unit cells. The second ROIC is disposed outwardly from the first ROIC and comprises a second unit cells. Electrically conductive vias are disposed through the second ROIC and at least into the first ROIC. The detector array is disposed outwardly from the second ROIC. The detector array is configured to detect high dynamic range infrared light and comprises detector pixels. Each detector pixel is configured to generate a current in response to detecting light and send the current to a via. A via is configured to send the signal to a second unit cell and a first unit cell.

According to certain embodiments, a method includes generating, by a detector pixel of a detector array, a current in response to detecting light. The detector array comprises detector pixels and is disposed outwardly from a second readout integrated circuit (ROIC). The current is sent by the detector pixel to a via of a plurality of electrically conductive vias disposed through the second ROIC and at least into a first ROIC. The signal is sent by the via to a second unit cell of the second ROIC and to a first unit cell of the first ROIC. The first ROIC comprises first unit cells, and the second ROIC is disposed outwardly from the first ROIC and comprises second unit cells.

According to certain embodiments, an apparatus comprises a first readout integrated circuit (ROIC), a second ROIC, a detector array, and a switch. The first ROIC comprises first unit cells and operates as a high flux ROIC configured to process the current to capture higher flux detected light. The second ROIC is disposed outwardly from the first ROIC and comprises second unit cells. The second ROIC operates as a low flux ROIC configured to process the current to capture lower flux detected light. Electrically conductive vias are disposed through the second ROIC and at least into the first ROIC. The detector array is disposed outwardly from the second ROIC and comprises detector pixels. Each detector pixel is configured to generate a current in response to detecting light and to send the current to a via. The via is configured to send the signal to a second unit cell and a first unit cell. The switch is coupled to the detector array and is configured, for a first time period, to send the current to the first ROIC operating as a high flux ROIC and, for a second time period, to send the current to the second ROIC operating as a low flux ROIC. The second time period is greater than the first time period.

Certain embodiments of the invention may provide one or more technical advantages. A technical advantage of one embodiment may be that a detector system may include two or more ROICs. Different ROICs may perform different operations. As an example, one ROIC may process current to capture higher flux light, and another ROIC may be used to process current to capture lower flux light. As another example, one ROIC may be used to process current associated with light of one wavelength band, and another ROIC may be used to process current associated with light of a different wavelength band. Another technical advantage of one embodiment may be that the ROICs may be stacked substantially on top of each other. Stacking the ROICs may allow for more efficient use of substrate area.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
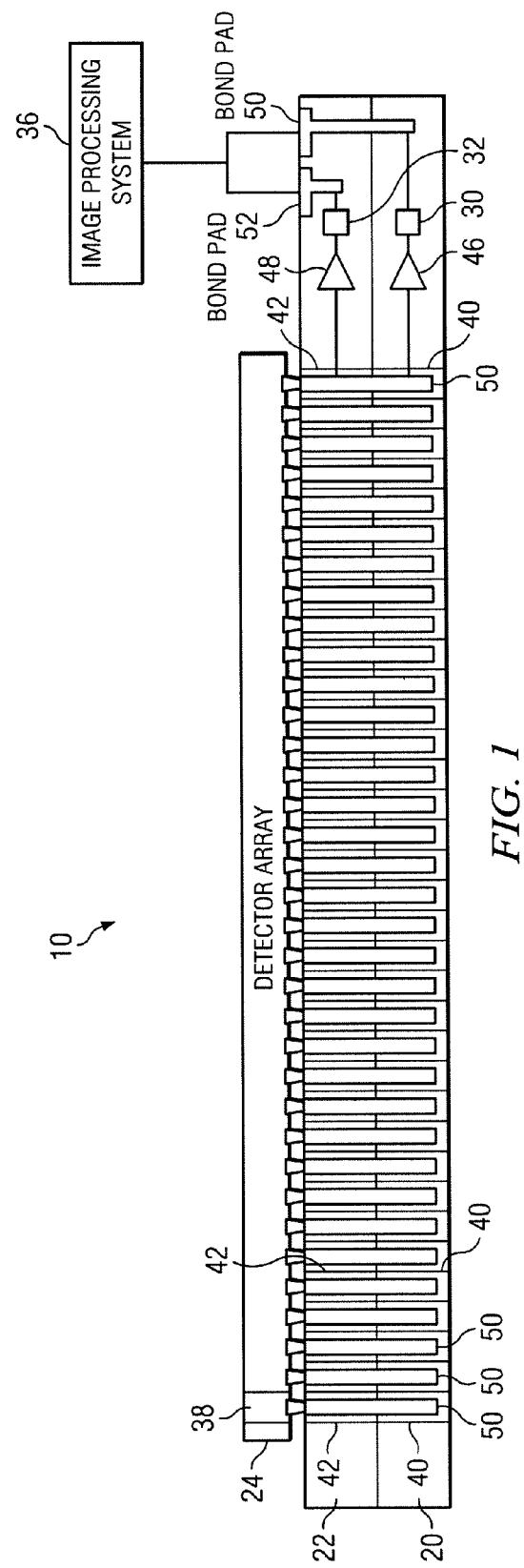
FIG. 1 illustrates an example of an apparatus that includes stacked ROICs configured to process detector signals.
Figure 2:
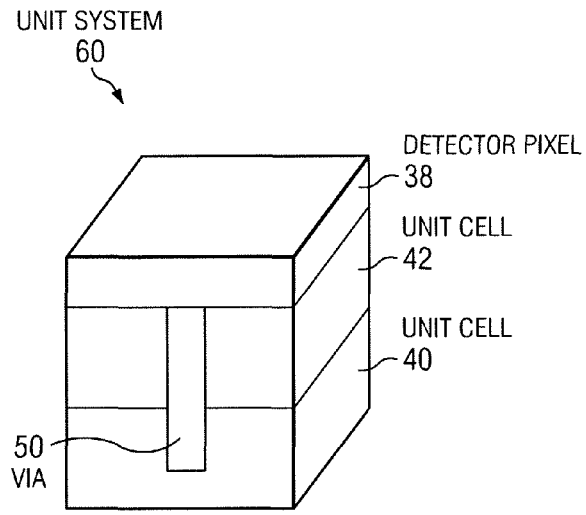
FIGS. 2 and 3 illustrate an example of a unit system.
Figure 3:
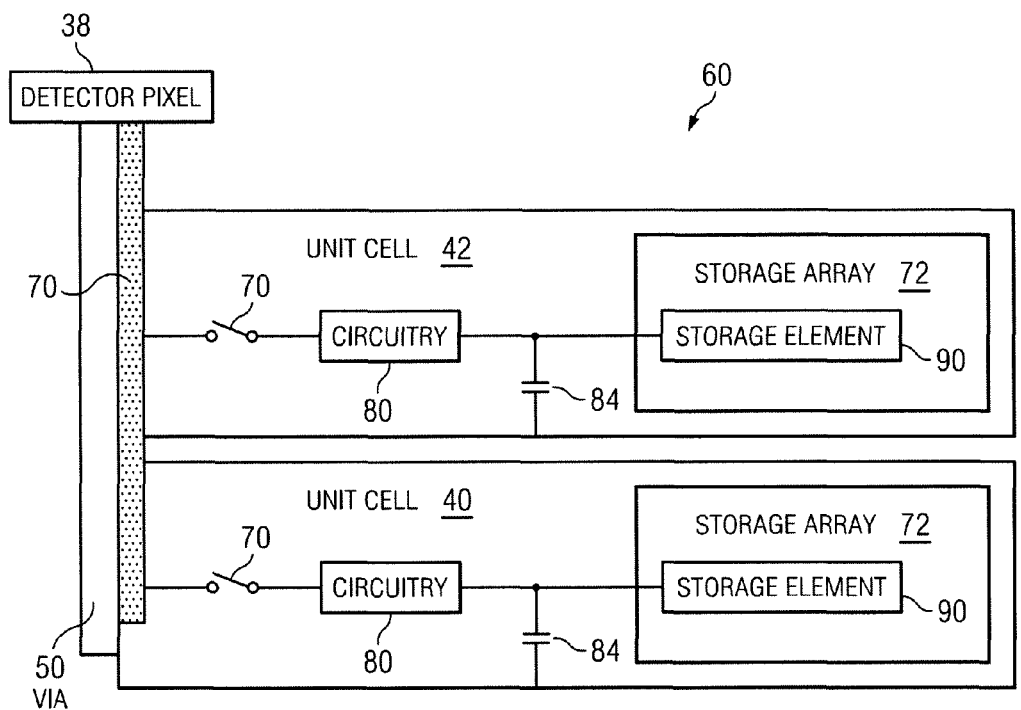

Embodiments of the present invention and its advantages are best understood by referring to FIGS. 1 through 3 of the drawings, like numerals being used for like and corresponding parts of the various drawings.

FIG. 1 illustrates an example of an apparatus that includes stacked ROICs configured to process detector signals. In certain embodiments, the ROICs may perform different operations. In certain embodiments, stacking the ROICs may allow for more efficient use of substrate area.

In the illustrated example, apparatus 10 comprises a first readout integrated circuit (ROIC) 20, a second ROIC 22, a detector array 24, and an image processing system 36 coupled as shown. ROICs 40 and 42 comprise one or more column amplifiers 46 and 48 and buffers 30 and 32, respectively. Bond pads 50 and 52 provide output from ROICs 20 and 22, respectively.

In the illustrated example, first ROIC 20 comprises first unit cells 40. Second ROIC 22 is disposed outwardly from first ROIC 20 and comprises second unit cells 42. Electrically conductive vertical interconnect accesses (vias) 50 are disposed through second ROIC 22 and at least into and perhaps through first ROIC 20. Detector array 24 is disposed outwardly from second ROIC 22 and comprises detector pixels 38. Each detector pixel is configured to generate a current in response to detecting light and send the current to a via 50, which is configured to send the signal to a second unit cell 42 and a first unit cell 40. Column amplifiers 46 and 48 amplify output of unit cells 40 and 42, respectively. Bond pads 50 and 52 provide the amplified output from column amplifiers 46 and 48, respectively. Buffers 30 and 32 buffer output from ROICs 20 and 22, respectively. Image processing system 36 receives output from buffers 30 and 32 and generates image data from the output that may be used to initiate display of an image.

In certain embodiments, each of 38, 40, and 42 may represent different functional circuits that correspond to different substrates on which complementary metal-oxide-semiconductor (CMOS) circuitry is formed. The cut away view of apparatus 10 shows only one row of detector pixels 38 and unit cells 40 and 42. Detector array 24 and ROICs 20 and 22, however, may include any suitable number of rows and columns of detector pixels 38 and unit cells 40 and 42, respectively.

In certain embodiments, detector array 24 comprises an array of detector pixels 38. In the embodiments, a detector pixel 38 comprises a photodetector that senses and converts radiation into an analog electrical signal that may manipulated by a unit cell 40 and/or 42. A detector pixel 38 may detect light of any suitable radiant flux. For example, a detector pixel 38 may detect light of a higher flux (for example, greater than $10^{15}$ photons/cm$^2$·sec) and/or light of a lower flux (for example, less than $10^{15}$ photons/cm$^2$·sec).

A detector pixel 38 may detect light of any suitable wavelength band. Examples of wavelength bands include short wavelength infrared (IR) (SWIR) (approximately 1000 to 3000 nm), medium wavelength IR (MWIR) (approximately 3000 to 8000 nm), long wavelength IR (LWIR) (approximately 7000 to 14,000 nm), and very long wavelength IR (VLWIR) (approximately 12,000 to 30,000 nm), as well as bands above or below the IR bands. In certain embodiments, detector array 24 may Detector pixels 38 may be sensitive to a common wavelength band, or may include a set of pixels 38 sensitive to one wavelength band and one or more other sets of pixels 38 sensitive to one or more other wavelength bands. For example, a dual detector array may comprise a first set of pixels 38 sensitive to a first wavelength band and a second set of pixels 38 sensitive to a second wavelength band. The first and second wavelength bands may be any suitable wavelength bands. For example, the first wavelength band may be SWIR and the second wavelength band may be MWIR.

Detector array 24 may detect light of any suitable luminance. In certain embodiments, detector array 24 may detect light (such as infrared light) in a high dynamic range of luminance. For example, detector array 24 may have a dynamic range with a value x, where x is an element of 60 to 90, 90 to 120, or greater than 120 decibels (dB)

In certain embodiments, an ROIC 20 or 22 is an electrical circuit multiplexer that interfaces with detector array 24 and operates as analog dynamic range management circuitry. An ROIC 20 or 22 comprises an array of unit cells 40 or 42 that each bias a detector pixel 38. A unit cell 40 or 42 integrates charge received from a detector pixel 38 into a capacitor. First ROIC 20 comprises first unit cells 40, and second ROIC 22 comprises second unit cells 42. An example of a unit cell is described with reference to FIG. 2.

In certain embodiments, ROIC 20 or 22 may be formed from a silicon-based substrate. CMOS circuitry may be formed outwardly from the substrate by etching, growing, and disposing layers of material. The array of detector pixels 38 may be hybridized to the substrate of ROIC 20 or 22. Certain circuits of ROIC 20 or 22 may be made monolithically with detector pixels 38 or may be formed separately from detector pixels 38.

In certain embodiments, one ROIC (first or second ROIC) may operate as a high flux sensing ROIC (or a high flux sensing low power dissipation ROIC), and the other ROIC (second or first ROIC) may operate as a low flux sensing ROIC (or a low flux sensing high power dissipation ROIC). For example, first ROIC 20 may operate as a high sensing flux ROIC and second ROIC 22 may operate as a low sensing flux ROIC.

A high flux ROIC may be configured to process current to capture higher flux light. In certain embodiments, the high flux ROIC may be an ROIC that consumes less power than a low flux ROIC. Examples include direct injection (DI) unit cell. In certain embodiments, sub-frame averaging (SFA) may be used to average a number of short sub-frame integrations to allow a longer total integration time that yields a larger capacitive bucket size.

A low flux ROIC may be configured to process photo current generated by lower flux light. In certain embodiments, the low flux ROIC may be an ROIC that consumes more power than a high flux ROIC. Examples include a capacitive transimpedance amplifier (CTIA) and a buffered direct injection (BDI) unit cell. In certain embodiments, a multi-frame averaging (MFA) operation may be used to extend the total integration time over multiple frame times, which may compensate for decreased incident flux.

In certain embodiments, first ROIC 20 may be configured to process current associated with light of a first wavelength band, and second ROIC 22 may be configured to process current associated with light of a second wavelength band that may be the same as or different from the first wavelength band. ROICs 20 and 22 may process any suitable wavelength bands, for example, the wavelength bands listed above.

In certain embodiments, detector array 24 may be configured to send current to ROICs 20 and 22 by alternating between ROICs 20 and 22. For example, detector array 24 may send the current to an ROIC operating as a high flux ROIC for a first time period, and then to the other ROIC operating as a low flux ROIC for a second time period. The second time period may be greater than, equal to, or less than the first time period. For example, the second time period (for the low flux ROIC) may be greater than the first time period (for the high flux ROIC).

In certain examples, current may be sent to ROICs 20 and 22 according to a schedule that may achieve temporal alignment among frames of different wavelength bands. In the examples, current may be sent to first ROIC 20 integrating a first wavelength band (for example, the LWIR band) and to second ROIC 22 integrating a second wavelength band (for example, the MWIR band). Current may be sent to first ROIC 20 for a first time period that occurs before and after a second time period during which current is sent to second ROIC 22. The first and second time periods may have any suitable duration, and the first time period may be greater than, equal to, or less than the second time period. For example, the first time period may be approximately 1 millisecond, and the second time period may be approximately 2 to 5 milliseconds.

In certain embodiments, ROICs 20 and 22 may process in parallel and output complete arrays of data. A complete array of data may refer to data that includes output from at least most or all unit cells of the ROIC. A complete array of data may be used to generate a frame of an image. In certain embodiments, apparatus 10 may output one or more first frames of data generated by first ROIC 20, and then output one or more second frames of data generated by second ROIC 22.

In certain embodiments, one or more first column amplifiers 46 may be configured to amplify output from first ROIC 20, and one or more second column amplifiers 48 may be configured to amplify output from second ROIC 22.

Examples of column amplifiers include single-ended or differential CTIA per column or voltage mode amplifier per column amplifiers.

In certain embodiments, one or more first buffers 30 may be configured to buffer output from first ROIC 20, and one or more second buffers 32 may be configured to buffer output from second ROIC 22. Examples of buffers include voltage mode amplifiers such as voltage followers, single-ended, or differential amplifiers.

In certain embodiments, image processing system 36 may receive one or more first frames of data generated by first ROIC 20 and one or more second frames of data generated by second ROIC 22. Image processing system 36 may analyze the first and second frames of data to generate an image in any suitable manner. For example, image processing system may fuse first and second frame data to yield composite frame data, and generate a frame of an image from the composite frame data.

FIG. 2 illustrates an example of a unit system 60. In the example, unit system 60 includes a unit cell 40, a unit cell 42, and a detector pixel 38. Via 50 electrically couples a detector pixel 38 to a unit cell 40 and/or unit cell 42 and may transport a current from detector pixel 38 to unit cell 42 and/or unit cell 40.

In certain embodiments, via 50 may be a hole (such as an opening or aperture) with conductive material disposed within the hole. Any suitable conductive material may be used, for example, an insulating oxide material. Via 50 may be suitable via, such as a through silicon via (TSV). Via 50 may have any suitable form. For example, via 50 may have openings on opposing surfaces of a substrate, an opening on only one surface, or no opening on any surface.

FIG. 3 illustrates unit system 60 in more detail. In the illustrated example, unit system 60 includes detector pixel 38, unit cells 40 and 42, and via 50 coupled as shown. Each unit cell 40 and 42 includes a switch 70, circuitry 80, a capacitor 84, and a storage array 72. Storage array 72 includes storage elements 90 that store output from unit cells 40 or 42 of an ROIC 20 or 22. In an example of operation, detector pixel 38 detects light and outputs a current in response to detecting light. Switch 70 directs the current to unit cell 40 and/or 42 through via 50. Unit cells 40 and 42 process the current to yield an output, which is stored at storage elements 90.

In certain embodiments, unit cell 40 or 42 may have a capacitor 84 and circuitry 80, which may include a ramp circuit and an analog-to-digital converter (A/D). Capacitor 84 may have a first and an opposed second plate. The ramp circuit may provide a voltage ramp to the capacitor first plate. The capacitor second plate may receive current from detector pixel 38. The A/D receives analog output from the capacitor second plate and provides digital output to a storage element 90. A counter may be coupled in parallel to outputs of an array of unit cells, and may accumulate digital outputs from each digital inverter in a global count.

Switch 70 resides in at least some unit cells, and may provide controlled connections to via 50. In certain embodiments, switch 70 may be configured to send current to ROICs 20 and 22 by alternating between ROICs 20 and 22. For example, switch 70 may send the current to an ROIC operating as a high flux ROIC for a first time period, and then to the other ROIC operating as a low flux ROIC for a second time period. The second time period may be greater than, equal to, or less than the first time period. For example, the second time period (for the low flux ROIC) may be greater than the first time period (for the high flux ROIC).

In certain embodiments, switch 70 may send the current to an ROIC used for a first wavelength band for a first time period, and then the current to the other ROIC used for a second wavelength band for a second time period, where the second wavelength band includes larger wavelengths. The second time period may be greater than, equal to, or less than the first time period. For example, the second time period (for the larger wavelengths) may be greater than or less than the first time period (for the smaller wavelengths). For example, the first time period may be a value in the range of 1 to 100 microsecond (μs), and the second time period may be a value in the range of 1000 to 20000 μs.

Unit cell 40 or 42 may be any suitable size, for example, less than 20 microns×20 microns (20 μm×20 μm) square. Unit cell 40 or 42 may operate with any suitable frame rate, such as 30 hertz (Hz), 60 Hz, 120 Hz, or greater frame rates.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. For example, the operations of ROIC 20 or 22 may be performed by more than one component. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

A component of the systems and apparatuses disclosed herein may include an interface, logic, memory, and/or other suitable element. An interface receives input, sends output, processes the input and/or output, and/or performs other suitable operation. An interface may comprise hardware and/or software.

Logic performs the operations of the component, for example, executes instructions to generate output from input. Logic may include hardware, software, and/or other logic. Logic may be encoded in one or more tangible media and may perform operations when executed by a computer. Certain logic, such as a processor, may manage the operation of a component. Examples of a processor include one or more computers, one or more microprocessors, one or more applications, and/or other logic.

In particular embodiments, the operations of the embodiments may be performed by one or more computer readable media encoded with a computer program, software, computer executable instructions, and/or instructions capable of being executed by a computer. In particular embodiments, the operations of the embodiments may be performed by one or more computer readable media storing, embodied with, and/or encoded with a computer program and/or having a stored and/or an encoded computer program.

A memory stores information. A memory may comprise one or more non-transitory, tangible, computer-readable, and/or computer-executable storage media. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Components of the systems and apparatuses may be coupled by any suitable communication network. A communication network may comprise all or a portion of one or more of the following: a public switched telephone network (PSTN), a public or private data network, a local area network (LAN), a metropolitan area network (MAN), a wide area network (WAN), a local, regional, or global communication or computer network such as the Internet, a wireline or wireless network, an enterprise intranet, other suitable communication link, or any combination of any of the preceding.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. An apparatus comprising:
a first readout integrated circuit (ROIC) comprising a plurality of first unit cells;
a second ROIC disposed outwardly in a first direction from the first ROIC and comprising a plurality of second unit cells, a plurality of electrically conductive vias disposed through the second ROIC and at least into the first ROIC; and
a dual band detector array disposed outwardly in the first direction from the second ROIC and configured to detect high dynamic range infrared light, the detector array comprising a plurality of detector pixels, each detector pixel configured to:
generate a current in response to detecting light; and
send the current to a via of the plurality of electrically conductive vias, the via configured to send the current to a second unit cell of the plurality of second unit cells and a first unit cell of the plurality of first unit cells.

2. The apparatus of claim 1:
one of the first ROIC or the second ROIC operating as a high flux ROIC configured to process the current to capture higher flux detected light; and
the other ROIC of the first ROIC or the second ROIC operating as a low flux ROIC configured to process the current to capture lower flux detected light.

3. The apparatus of claim 1:
one of the first ROIC or the second ROIC operating as a high flux low power ROIC configured to process the current to capture higher flux detected light while using lower power; and
the other ROIC of the first ROIC or the second ROIC operating as a low flux high power ROIC configured to process the current to capture lower flux detected light while using higher power.

4. The apparatus of claim 1:
the first ROIC configured to process the current associated with detected light of a first wavelength band; and
the second ROIC configured to process the current associated with detected light of a second wavelength band distinct from the first wavelength band.

5. The apparatus of claim 1, further comprising a switch coupled to the detector array and configured to:
send the current to the first ROIC for a first time period; and
send the current to the second ROIC for a second time period occurring after the first time period.

6. The apparatus of claim 1, further comprising a switch coupled to the detector array and configured to:
for a first time period, send the current to one of the first ROIC or the second ROIC operating as a high flux ROIC; and
for a second time period, send the current to the other ROIC of the first ROIC or the second ROIC operating as a low flux ROIC, the second time period greater than the first time period.

7. The apparatus of claim 1, further comprising:
one or more first column amplifiers coupled to the first ROIC and configured to amplify output from the first ROIC; and
one or more second column amplifiers coupled to the second ROIC and configured to amplify output from the second ROIC.

8. The apparatus of claim 1, further comprising:
one or more first buffers coupled to the first ROIC and configured to buffer output from the first ROIC; and
one or more second buffers coupled to the second ROIC and configured to buffer output from the second ROIC.

9. The apparatus of claim 1, further configured to:
output one or more first frames of data generated by the first ROIC; and
output one or more second frames of data generated by the second ROIC.

10. A method comprising:
generating, by a detector pixel of a dual band detector array, a current in response to detecting a high dynamic range infrared light, the detector array comprising a plurality of detector pixels, the detector array disposed outwardly in a first direction from a second readout integrated circuit (ROIC);
sending, by the detector pixel, the current to a via of a plurality of electrically conductive vias disposed through the second ROIC and at least into a first ROIC; and
sending, by the via, the current to a second unit cell of the second ROIC and to a first unit cell of the first ROIC, the first ROIC comprising a plurality of first unit cells, the second ROIC disposed outwardly in the first direction from the first ROIC and comprising a plurality of second unit cells.

11. The method of claim 10, further comprising:
processing the current to capture higher flux detected light, the processing performed by one of the first ROIC or the second ROIC operating as a high flux ROIC; and
processing the current to capture lower flux detected light, the processing performed by the other ROIC of the first ROIC or the second ROIC operating as a low flux ROIC.

12. The method of claim 10, further comprising:
processing the current to capture higher flux detected light while using lower power, the processing performed by one of the first ROIC or the second ROIC operating as a high flux low power ROIC; and
processing the current to capture lower flux detected light while using higher power, the processing performed by the other ROIC of the first ROIC or the second ROIC operating as a low flux high power ROIC.

13. The method of claim 10, further comprising:
processing, by the first ROIC, the current associated with detected light of a first wavelength band; and
processing, by the second the current associated with detected light of a second wavelength band distinct from the first wavelength band.

14. The method of claim 10, further comprising:
sending, by a switch coupled to the detector array, the current to the first ROIC for a first time period; and
sending, by the switch, the current to the second ROIC for a second time period occurring after the first time period.

15. The method of claim 10, further comprising:
for a first time period, sending, by a switch coupled to the detector array, the current to one of the first ROIC or the second ROIC operating as a high flux ROIC; and
for a second time period, sending, by the switch, the current to the other ROIC of the first ROIC or the second ROIC operating as a low flux ROIC, the second time period greater than the first time period.

16. The method of claim 10, further comprising:
amplifying, by one or more first column amplifiers coupled to the first ROIC, output from the first ROIC; and
amplifying, by one or more second column amplifiers coupled to the second ROIC, output from the second ROIC.

17. The method of claim 10, further comprising:
buffering, by one or more first buffers coupled to the first ROIC, output from the first ROIC; and
buffering, by one or more second buffers coupled to the second ROIC, output from the second ROIC.

18. The method of claim 10, further comprising:
outputting one or more first frames of data generated by the first ROIC; and
outputting one or more second frames of data generated by the second ROIC.

19. An apparatus comprising:
a first readout integrated circuit (ROIC) comprising a plurality of first unit cells, the first ROIC operating as a high flux ROIC configured to process a current to capture higher flux detected light;
a second ROIC disposed outwardly in a first direction from the first ROIC and comprising a plurality of second unit cells, the second ROIC operating as a low flux ROIC configured to process the current to capture lower flux detected light, a plurality of electrically conductive vias disposed through the second ROIC and at least into the first ROIC;
a dual band detector array disposed outwardly in the first direction from the second ROIC, the detector array configured to detect high dynamic range infrared light and comprising a plurality of detector pixels, each detector pixel configured to:
generate the current in response to detecting light; and
send the current to a via of the plurality of electrically conductive vias, the via configured to send the signal to a second unit cell of the second ROIC and a first unit cell of the first ROIC; and
a switch coupled to the detector array and configured to:
for a first time period, send the current to the first ROIC operating as a high flux ROIC; and
for a second time period, send the current to the second ROIC operating as a low flux ROIC, the second time period greater than the first time period.

20. The apparatus of claim 19:
the first ROIC configured to process the current associated with detected light of a first wavelength band; and
the second ROIC configured to process the current associated with detected light of a second wavelength band distinct from the first wavelength band.

* * * * *